United States Patent [19]
Gardner, Jr. et al.

[11] Patent Number: 5,939,237
[45] Date of Patent: *Aug. 17, 1999

[54] TOP COATS FOR SHOOT AND RUN PRINTING PLATES

[75] Inventors: James P. Gardner, Jr., Stillwater; Leonard J. Stulc, Shafer; Richard A. Johnson, Spring Lake Park; Dennis E. Vogel, Lake Elmo, all of Minn.

[73] Assignee: Imation Corp., Oakdale, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/960,175

[22] Filed: Oct. 29, 1997

Related U.S. Application Data

[60] Continuation of application No. 08/539,329, Oct. 4, 1995, abandoned, which is a division of application No. 08/311,510, Sep. 23, 1994, Pat. No. 5,506,090.

[51] Int. Cl.$^6$ ........................................ G03C 1/73
[52] U.S. Cl. ..................... 430/273.1; 430/270.1; 430/271.1
[58] Field of Search ............... 430/270.1, 271.1, 430/273.1

[56] References Cited

U.S. PATENT DOCUMENTS

| | | | |
|---|---|---|---|
| 3,615,446 | 10/1971 | Wong | 430/271 |
| 3,793,033 | 2/1974 | Mukhergee | 430/285 |
| 4,162,920 | 7/1979 | Gillich | 106/14.5 |
| 4,275,092 | 6/1981 | Nakayama et al. | 430/302 |
| 5,102,771 | 4/1992 | Vogel et al. | 430/271 |
| 5,225,316 | 7/1993 | Vogel et al. | 430/270 |
| 5,258,263 | 11/1993 | Cheema et al. | 430/309 |
| 5,395,734 | 3/1995 | Vogel et al. | 430/270 |
| 5,407,764 | 4/1995 | Cheema et al. | 430/273.1 |
| 5,514,522 | 5/1996 | Fitzgerald et al. | 430/284.1 |
| 5,516,620 | 5/1996 | Cheng et al. | 430/325 |
| 5,556,924 | 9/1996 | Fitzgerald et al. | 430/284.1 |
| 5,561,029 | 10/1996 | Fitzgerald et al. | 430/281.1 |
| 5,599,650 | 2/1997 | Bi et al. | 430/273.1 |
| 5,607,816 | 3/1997 | Fitzgerald et al. | 430/271.1 |
| 5,616,449 | 4/1997 | Cheng et al. | 430/281.1 |
| 5,620,827 | 4/1997 | Cheng et al. | 430/273.1 |

FOREIGN PATENT DOCUMENTS

| | | |
|---|---|---|
| 0 231 112 | 8/1987 | European Pat. Off. . |
| 0 290 916 A2 | 11/1988 | European Pat. Off. . |
| 0 488 372 A1 | 6/1992 | European Pat. Off. . |
| 0 600 615 A2 | 6/1994 | European Pat. Off. . |
| 25 22 784 | 12/1975 | Germany . |
| 05/313 376 | 11/1993 | Japan . |
| 735129 | 8/1955 | United Kingdom . |
| WO 92/05474 | 4/1992 | WIPO . |
| WO 95/12837 | 5/1995 | WIPO . |
| WO 96/34317 | 10/1996 | WIPO . |
| WO 97/12759 | 4/1997 | WIPO . |

*Primary Examiner*—Maria Nuzzolillo
*Assistant Examiner*—Laura Weiner

[57] ABSTRACT

A no-process printing plate forming photosensitive article having a protective top coat layer is described. The top coat layer may be a water soluble or dispersible polymer, sol, salt, or mixture thereof. The protective top coat layer may provide the no-process printing plate with protection from contamination during handling, improved suppression of odors during imaging, and improved roll-up performance on press. The hydrophilic protective top coat is removed on press by action of the fountain solution and/or ink.

11 Claims, No Drawings

TOP COATS FOR SHOOT AND RUN PRINTING PLATES

This is a continuation of application Ser. No. 08/539,329 filed Oct. 4, 1995 now abandoned, which is a Divisional of 08/311,510, filed Sep. 23, 1994, now U.S. Pat. No. 5,506,090.

FIELD OF THE INVENTION

This invention relates to protective layers on photosensitive printing plate forming constructions which need not undergo development prior to being put on press. It also relates to a process for using those imageable articles.

BACKGROUND OF THE INVENTION

Lithographic processes generally employ at least two steps to prepare a plate for use in a printing press, namely exposure of a plate coated with a photosensitive composition to a positive or negative information-bearing light source to create a photoimage and a subsequent development step. Typically, development involves washing away material from the portions of the plate exposed to a light source in a positive acting system or from the unexposed portions of the plate in a negative acting system. The development is aided by a developer solution which may be highly alkaline, e.g., at a pH of 13 or greater, and which may contain organic solvent. Alternatively, heating has sometimes been employed to effect development of the photoimage.

Both of the above-described development processes tend to suffer from the drawback of being relatively time-consuming, environmentally unsound because of development liquid effluent, and sometimes expensive. Furthermore, when volatile organic or strongly alkaline developer solutions are used, their disposal presents a particularly difficult environmental problem.

The industry has long desired photosensitive compositions which can be used in development processes which do not have the above-described drawbacks.

A variety of different materials have been used in photosensitive compositions in the past. Photosensitive compositions employing polymers with pendant acid sensitive moieties have been described in the art (Ito, H.; Ueda, M. *Macromolecules* 1988, 21, 1475–82). o-Nitrobenzyl substituted polyacrylates have been described in U.S. Pat. No. 3,849,137 (Nov. 19, 1974; Barzynski). t-Butyl substituted polyacrylates have also been reported (Ito, H.; Willson, C. G. in *Proc. SPIE-Int. Soc. Opt. Eng.* 1987, 771, 24; and U.S. Pat. No. 4,491,628 (Jan. 1, 1985; Ito).

U.S. Pat. No. 4,963,463 (Koshiba et al.) claims a radiation sensitive resin composition comprising an alkali soluble resin, an o-quinone diazide, and acid sensitive esters of nitrobenzyl or cyanobenzyl alcohol.

End-capped polyphthalaldehyde has been employed in imaging systems in combination with onium salts which were used as a source of photogenerated acid (Ito, H.; Willson, C. G. *Polym. Eng. Sci.* 1983, 23, 1013). Photoresists based on thermal polycarbonate degradation in the presence of photogenerated acid have also been described (Frechet, J. M. J.; Bouchard, F.; Houlihan, F. M.; Kryczka, B.; Eichler, E.; Clecak, N.; Willson, C. G. *J. Imag. Sci.* 1986, 30, 59). Both of these systems function by cleavage of the polymer backbone.

Canadian Patent No. 672,947 (Canadian Industries Ltd.) describes protective films comprising copolymers of tetrahydropyran-2-yl acrylates, and glycidyl esters of acrylates. These films are thermally processed, thereby effecting cleavage of the tetrahydropyran-2-yl groups, and subsequently causing cross-linking of the carboxylic acid and the epoxy residues.

Benzyl, benzhydryl, and triphenylmethyl acrylates have been imaged using high energy radiation (e.g., electron beam, x-ray, and ion beam) sources followed by development with aqueous alkaline solutions as described in Japanese published applications 59-075244 (Apr. 27, 1984; Hitachi, Ltd.), and 58-068743 (Apr. 23, 1983; Hitachi, Ltd.).

Dimethylbenzyl methacrylates have been employed in combination with iodonium salts as deep-UV photoresists (Ito, H. *Polym. Mater. Sci. Eng.* 1989, 60, 142).

α-Substituted benzyl methacrylate polymers have been photoimaged and developed with an alkaline developer (Ito, H.; Ueda, M.; Ebina, M. *ACS Symp. Ser.* 1984, 266, 57–73).

Japanese published applications 63-256492 (Oct. 24, 1988; Fuji Photo Film Co., Ltd.) and 63-317388 (Dec. 26, 1988; Fuji Photo Film Co., Ltd.) describe several direct-image lithographic plate formulations employing polymers having side-chain groups which, following an etching development step, cleave to form hydroxyl and carboxyl groups.

Japanese published patent applications 53-094691 (Oct. 24, 1989, Fuji Photo Film) and 53-100192 (Oct. 30, 1989, Fuji Photo Film) describe lithographic plates containing polymers with acid labile groups including some alkoxyalkyl esters. The plates also contain cross-linking agents which appear to cross-link with carboxylic acid residues as they are formed. These plates appear to act in a negative-tone and may involve a development step.

Japanese published application 62-299,313 (Jun. 1, 1989, Matsushita Electric Industrial) describes the use of polymers containing acid anhydride residues in combination with o-nitrobenzyl esters of carboxylic acids. These polymers are sensitive only to UV radiation.

U.S. Pat. Nos. 4,072,527 and 3,458,311 are representative of a class of patents which disclose the use of non-photosensitive cover layers as oxygen barriers, particularly on acryloyl (and methacryloyl) containing photosensitive printing plate forming articles. The oxygen barrier layer is water-removable and is removed during the wash development of the printing plate.

U.S. Pat. No. 5,258,263 describes a no-process printing plate (i.e., a photosensitive article which does not have to be liquid developed before being used on press). This article has two photosensitive layers on a substrate. The photohardening layers are a hydrophilic photohardening layer overcoated with a hydrophobic photohardening layer as a top coat. The top-coat layer is clearly photosensitive (in that it hardens when irradiated to alter its removability during development processing) and is removed by wash-off development in non-irradiated areas.

U.S. Pat. Nos. 5,102,771 and 5,225,316 describe photosensitive compositions which comprise: (a) a photoinitiator which generates an acid upon exposure to radiation; and (b) a polymer having acid labile groups pendant from the polymer backbone, said pendant groups being represented by the formula

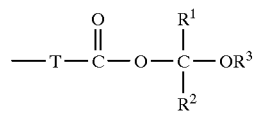

wherein:

$R^1$ and $R^2$ each represent H or an alkyl group with 1 to 18 carbon atoms with the proviso that at least one of $R^1$ and $R^2$ must be hydrogen; $R^3$ represents an alkyl group with 1 to 18 carbon atoms; or any two of $R^1$, $R^2$, and $R^3$ may together form a substituted or unsubstituted ring having from 3 to 36 carbon atoms; and T represents a divalent linking group bonded to the polymer backbone contains a total of from 0 (a covalent bond) or 1 to about 18 carbon atoms where up to one of each three carbon atoms may be replaced by oxygen, nitrogen, or sulfur atoms or combinations thereof. These compositions are used on an imageable article which comprises a substrate coated with the above-described photosensitive composition. These articles are used in processes in which the imageable article is irradiated and then directly placed on press for use as a printing plate without liquid wash-off development.

SUMMARY OF THE INVENTION

A photosensitive article capable of forming a no-process printing plate is described comprising a substrate having on at least one surface thereof a photosensitive composition which upon irradiation is, or on press becomes, either more or less hydrophilic than the composition which has not been irradiated, and over the photosensitive composition is an essentially photoinsensitive hydrophilic protective layer. The hydrophilic, photoinsensitive protective layer remains on the surface of the photosensitive layer after exposure and is removed by the action of the fountain, ink and/or printing press when the imaged plate is placed on press. The "no-process" article of the present invention is defined as a photosensitive element which can be irradiated, optionally have a fountain solution placed thereon, and placed on press to be inked and run on press without any prior liquid development step to remove irradiated or non-irradiated areas from the photosensitive layer.

In one embodiment, the process of the invention involves the formation of an imaged article (e.g., printing plate) by 1) exposing a no-process imageable article (as disclosed herein) having a hydrophilic protective layer over a photosensitive composition to radiation (e.g., within a range absorbed by a photoinitiator or sensitized photoinitiator present in the imageable article) to form a latent image bearing article and thereafter on press, 2) optionally applying a fountain solution to the latent image bearing article, 3) applying ink to the latent image bearing article, steps 2) and/or 3) being performed while said hydrophilic protective layer is present on said article, thereby forming an imaged article. An alternative to the above process involves contacting the latent image bearing article with a dye, instead of ink to form an imaged article.

In another embodiment, the process of the invention involves the formation of an imaged article (e.g., printing plate) by 1) exposing a no-process imageable article (as disclosed herein) having a hydrophilic protective layer over a photosensitive composition to radiation (e.g., within a range absorbed by a photoinitiator present in the imageable article) to form a latent image bearing article and thereafter on press, 2) applying an emulsion comprising fountain solution and ink to the latent image bearing article, step 2) being performed while said hydrophilic protective layer is present on said article, thereby forming an imaged article.

DETAILED DESCRIPTION OF THE INVENTION

The photosensitive printing plate articles of the present invention may use any photosensitive composition on a substrate. The photosensitive composition upon irradiation is, or on press becomes, either more or less hydrophilic than the composition which has not been irradiated. There are numerous compositions in the literature reviewed above which are capable of providing this ability. The important and critical aspect of the present invention is the addition of the hydrophilic protective layer over the photosensitive composition.

Previous "no-process" constructions would not roll-up quickly on integrated printing presses, gave rise to uneven photographic speed across the surface of the construction upon exposure, tended to give off odors (e.g., U.S. Pat. Nos. 5,102,771 and 5,225,316), and were easily contaminated with finger prints. The top coats of the present invention improve these features without requiring a wash-off development step to remove the protective layer. In more conventional lithographic printing plate development where there is wash-off development of the more soluble areas in the photosensitive compositions, protective layers had to be capable of being washed off during development. Since the wash-off development occurred before being placed on press, the plates were not put on press with the protective layer still present on the plate. Additionally, as the objective of the no-process plates was to avoid wash-off development steps, it is clearly unobvious to use a protective layer over the photosensitive layer as that would apparently block the hydrophilic/hydrophobic differentiating function of the photosensitive layer from contact with ink solutions.

One example of a photosensitive composition of the present invention comprises a hydrophilic photohardening layer over-coated with a hydrophobic photohardening layer as described in U.S. Pat. No. 5,258,263. In such a construction, exposure to radiation does not lead immediately to differences in hydrophilicity between exposed and unexposed areas of the composition. However, upon contact with the printing ink and aqueous fountain solution of the printing press, the hydrophobic layer is removed in the unexposed regions, resulting in the exposed areas being more hydrophobic than the unexposed areas.

The preferred photosensitive composition of the present invention comprises a photoinitiator which generates an acid upon exposure to radiation and a polymer having acid labile groups pendant from the polymer backbone, the pendant acid labile groups being represented by the general formula:

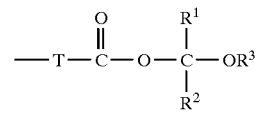

wherein $R^1$ and $R^2$ each represent H or an alkyl group with 1 to 18 carbon atoms with the proviso that at least one of $R^1$ and $R^2$ must be hydrogen; $R^3$ represents an alkyl group with 1 to 18 carbons; or any two of $R^1$, $R^2$, and $R^3$ may together form a substituted or unsubstituted ring having from 3 to 36 carbon atoms. With regard to $R^1$, $R^2$, and $R^3$, preferred alkyl groups are methyl and ethyl. Preferred ring structures are furanyl, pyranyl, and oxabicyclooctyl. T represents a divalent linking group bonded to the polymer backbone and contains from about 0 to about 18 carbon atoms where up to one of each three carbon atoms may be replaced with oxygen, nitrogen, or sulfur atoms or combinations thereof. Preferably, T should contain no functional groups which are more basic than the alkoxyalkyl ester moiety employed in the present invention. Representative examples of such functional groups (which are more basic than the alkoxyalkyl ester moiety) include, but are not limited to, amines, alkoxides, sulfides, amides, urethanes, imides, etc. Non-limiting examples of T include methyene, 1,5-pentanediyl, 2-oxo-propanediyl, phenylene, and the like.

The polymers of the present invention are preferably derived from any non-basic (i.e., not containing 1°, 2°, or 3° amines or phosphines) polymer backbone, and may be prepared by any of the known in the art methods for preparing polymers (such as free radical, anionic, condensation, and cationic polymerization). Non-limiting examples of non-basic polymer backbones are polyacrylates, polymethacrylates, polystyrenes, acrylonitrile-styrene copolymers, butadiene-styrene copolymers, polyolefins (e.g. polyethylene, polypropylene, polyisobutylene, etc.), polyesters, polyethers, polycarbonates, polysulfides, and the like. Examples of basic polymer backbones are those containing 1°, 2°, or 3° amines or phosphines; or 1° or 2° amides. Preferred polymer backbones are derived from free radical polymerized polymers. Particularly preferred polymer backbones are polyacrylates and polymethacrylates. Additionally, it may be desirable in some applications that the polymer matrix be cross-linked, while in other instances it may be preferable that there be no cross-linking.

Alkoxyalkyl ester moieties may be either incorporated within monomer units prior to polymerization or attached to already formed polymer backbones using methods well known in the chemical art. For example, in cases in which an active hydrogen atom is present on the polymer backbone (for example, —OH, —C(O)CH$_2$C(O)—, —SH, and the like), deprotonation with a strong base (such as sodium hydride, lithium diisopropylamide, potassium t-butoxide, or any other base having sufficient strength to abstract the active hydrogen atom), followed by condensation with alkoxyalkyl ester moieties having reactive groups such as epoxy, haloacyl, carboxyalkyl, and the like may be used to prepare the polymers of the present invention. In cases in which olefinic unsaturation is present, alkoxyalkyl ester moieties having alkenyl substituents may be added by reactions such as Diels-Alder 4+2 thermal cycloadditions or 2+2 photocycloaddition. In still other cases in which no recognized functionality is present (e.g., polyethylene, polypropylene, etc.), one may corona treat or otherwise oxidize said polymer to provide active hydrogen sites on the polymer backbone.

The photoinitiator used herein is one which generates acid upon exposure to radiation. Many such substances are known in the photoimaging art including, but not limited to, various onium compounds (e.g., sulfonium, iodonium, diazonium, etc.; particularly aryl derivatives thereof), and various organic compounds with photolabile halogen atoms (α-halo-p-nitrotoluenes, α-halomethyl-s-triazines, carbon tetrabromide, etc.) While the choice of photoinitiator is not critical, it is desirable that the photoinitiator have limited solubility in water in order to provide maximal inkability.

In a preferred embodiment, the photoinitiator is a substituted or unsubstituted diaryliodonium salt generally described by the formulae:

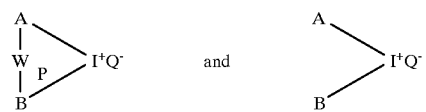

wherein A and B are substituted or unsubstituted aryl groups with a total of from 4 to 20 carbon atoms (e.g., substituted or unsubstituted phenyl, naphthyl, thienyl, and furanyl). W is selected from the group consisting of a carbon-carbon bond; oxygen; sulfur;

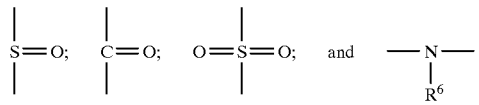

wherein $R^6$ is aryl (e.g., 6 to 20 carbon atoms) or acyl (e.g., 2 to 20 carbon atoms), or $R^7$—C—$R^8$ wherein $R^7$ and $R^8$ are individually selected from hydrogen, alkyl groups of 1 to 4 carbon atoms, and alkenyl groups of 2 to 4 carbon atoms, p is 0 or 1; and $Q^-$ is any anion capable of forming a stable salt with diphenyliodonium cation at room temperature, i.e., the anion must have a $pK_a$ less than about 16, and an oxidation potential of greater than about 0.7 V. Preferred anions $Q^-$ are complex halogenated metal anions such as hexafluorophosphate, hexafluoroantimonate, hexafluoroarsenate; borates such as tetrafluoroborate and tetraphenylborate. Particularly preferred anions are hexafluorophosphate, hexafluoroantimonate, hexfluoroarsenate, and tetrafluoroborate.

Non-limiting examples of suitable iodonium salts are salts of diphenyliodonium, dinaphthyliodonium, di(4-chlorophenyl)iodonium, ditolyliodonium, tolyl (dodecylphenyl)iodonium, naphthylphenyliodonium, (4-trifluoromethylphenyl)phenyliodonium, (4-ethylphenyl) phenyliodonium, di(4-acetylphenyl)iodonium, tolylphenyliodonium, anisylphenyliodonium, (4-butoxyphenyl)phenyliodonium, di(4-phenylphenyl) iodonium, di(carbomethoxyphenyl)iodonium, and the like. Diphenyliodonium salts are preferred.

The photolyzable organic halogen compounds which are useful in the present invention are those that upon exposure to radiation dissociate at one or more carbon-halogen bonds to form free radicals. The carbon-halogen bond dissociation energy should be between about 40 and 70 kcal/mole as taught in U.S. Pat. No. 3,515,552 (Jun. 2, 1970; Smith). Preferred photolyzable organic halogen compounds have from 1 to 40 carbon atoms, are non-gaseous at room temperature, and have a polarographic half-wave reduction potential greater than about −0.9 V as described in U.S. Pat. No. 3,640,718 (Feb. 8 1972; Smith) and U.S. Pat. No. 3,617,288 (Nov. 2, 1971; Hartman).

Examples of photolyzable organic halogen compounds are hexabromoethane, α,α,α',α'-tetrabromoxylene, carbon tetrabromide, m-nitro(tribromoacetyl)benzene, α,α,α-trichloroacetanilide, trichloromethylsulfonylbenzene, tribromoquinaldine, bis(pentachlorocyclopentadiene), tribromomethylquinoxaline, α,α-dibromo-p-nitrotoluene, α,α,α,α',α',α'-hexachloro-p-xylene, dibromotetrachloroethane, pentabromoethane, dibromodibenzoylmethane, carbon tetraiodide, halomethyl-s-triazines such as 2,4-bis(trichloromethyl)-6-methyl-s-triazine, 2,4,6-tris(trichloromethyl)-s-triazine, and 2,4-bis (trichloromethyl)-6-(p-methoxystyryl)-s-triazine, anthracenes, alkoxy-substituted anthracenes, etc.

The iodonium salts or photolyzable organic halogen compounds employed in the present invention may be either exposed to ultraviolet radiation or sensitized into the visible spectrum. Wavelengths between 250 nm and 1100 nm inclusive may be used. Compounds useful as sensitizing dyes of this invention include, but are not limited to aryl nitrones, xanthenes, anthraquinones, substituted diaryl- and triarylmethanes, methines, merocyanines, and polymethines, thiazoles, substituted and unsubstituted polycyclic aromatic hydrocarbons, and pyrylium dyes.

In some instances it is desirable to add at least one additional polymer to the photosensitive compositions of the present invention. The polymers generate additional hydrophilic functionality upon exposure to light and treatment with aqueous solutions, and therefore, serve to increase the differential in wettability between the exposed and unexposed regions of the photosensitive composition. The additional polymer may be present in amounts up to 90 percent by weight, preferably not more than 50 percent. Preferably, the additional polymer is a homo- or co-polymer of an acid anhydride. Most preferably, the additional polymer is a homo- or co-polymer of maleic anhydride (e.g., GANTREZ™ AN139 available from GAF Corp., Wayne, N.J.).

Additionally, acid-base indicator dyes can be added to the formulation of the photosensitive compositions of the present invention. This can serve to give the plate a color initially as well as to give a printout image upon image-wise exposure. A further advantage of having visible dye present is that it tends to increase the handling time under fluorescent lights before the plate becomes over exposed.

The photosensitive compositions of the present invention are generally coated onto a substrate prior to use in an imaging application. The protective coating is then applied after the photosensitive coating or coatings are applied. Coating may be achieved by many methods well known in the imaging art (e.g., solvent casting, knife coating, extrusion, etc.). Suitable substrates on which the compositions of the present invention may be supported include, but are not limited to, metals (e.g., steel and aluminum plates, sheets, and foils); films or plates composed of various film-forming synthetic or high polymers including addition polymers (e.g., polyvinylidene chloride, polyvinyl chloride, polyvinyl acetate, polystyrene, polyisobutylene polymers and copolymers), and linear condensation polymers (e.g., polyethylene terephthalate, polyhexamethylene adipate, polyhexamethylene adipamide/adipate); nonwoven wood by-product based substrates such as paper and cardboard; and glass. Substrates may be transparent or opaque.

The photosensitive compositions of the present invention may contain various materials in combination with the essential ingredients of the present invention. For example, plasticizers, coating aids, antioxidants, surfactants, antistatic agents, waxes, ultraviolet radiation absorbers, and brighteners may be used without adversely affecting the practice of the invention. The various materials should preferably not contain functional groups which are more basic than the alkoxyalkyl ester employed in the present invention (e.g., free amines, alkoxides, sulfides, amides, urethanes, imides, etc.) as defined above, in a molar amount higher than the molar amount of photoacid precursor.

The top coats of the present invention are generally more hydrophilic in character than the photosensitive layer on which they are coated. One common measure of hydrophilicity is the contact angle of the coating with water, with more hydrophilic materials having lower contact angles in comparison to less hydrophilic materials. Thus, the preferred top coats of this invention will have lower contact angles with water than the photosensitive layers on which they are coated. In many cases, the contact angle of the top coat with water will be less than about 50°, and preferably less than 47°. In addition, the hydrophilic top coats of this invention are generally soluble in water and/or water based fountain solutions. The top coats of this invention must be capable of being removed after exposure on press by action of the fountain solution and/or the action of the press. The top coats of this invention are generally easily and quickly dissolved, dispersed, or otherwise taken up by the fountain solution and removed from the surface of the printing plate. The top coats of this invention may comprise materials such as polymers, inorganic salts, sols, and mixtures thereof.

Polymers useful in the preparation of top coats of the present invention include natural or synthetic polymers (including addition and condensation polymers) possessing functionality to give rise to hydrophilicity and/or water solubility. Such functionalities may include ionizable or ionic groups such as carboxylic acids, carboxylates, sulfonates, and ammoniums and non-ionic groups such as amides, ethers, amines, and hydroxyls. Examples of polymers containing such ionic groups include gum arabic, polymethacrylic acid, polyacrylic acid, polyvinyl sulfonic acid, and polydiallyldimethyl ammonium chloride. It is to be understood that for polymers containing acid functionality (e.g. carboxylic and sulfonic acids), polymers which have had the acid functionality wholly or partially converted to a salt (e.g. sodium, potassium, ammonium, etc.) are also included. Examples of such polymers include polymethacrylic acid sodium salt, polymethacrylic acid ammonium salt, and polyvinyl sulfonic acid sodium salt. Examples of polymers containing non-ionic groups include polyacrylamide, polyvinylpyrrolidone, and polyvinyl alcohol.

Inorganic salts useful in the preparation of top coats of the present invention may include any water soluble inorganic salt. Commonly these useful salts are halides, nitrates, and acetates of ammonium, group IA, IIA, IIB, and IIIB metals. Examples of useful inorganic salts include sodium nitrate, magnesium nitrate, ammonium nitrate, sodium chloride, lithium chloride, magnesium chloride, and lithium acetate.

Sols useful in the preparation of top coats of the present invention include hydrophilic colloidal solutions of tin oxide, zirconium oxide, titania, silica, and alumina. Alumina is most preferred. Such sols are commercially available, e.g., from Nalco Chemical Company.

The top coats of the present invention may be coated by a variety of methods known in the art. Such coating methods include but are not limited to gravure coating, roll coating, and extrusion coating.

The thickness of the top coat may vary depending on the specific properties desired for the top coat. In general, for top coats of similar composition, thinner top coats will lead to faster roll-ups on press. The specific thickness of the top coat will depend on the balance of properties desired for a particular application, as long as enough is present to form a continuous layer. However, in general the top coat will have a thickness between 0.01 and 1.5 microns, preferably between 0.1 and 1.0 microns, and more preferably between 0.25 and 0.75 microns.

Additionally, it may be desirable to include in the topcoat of the present invention at least one hydrophilizing agent. Suitable hydrophilizing agents increase the wettability in exposed regions without affecting the wettability in unexposed regions of the photosensitive composition, thereby increasing the differential in wettability between exposed and unexposed regions. Preferably, at least one hydrophilizing agent is a basic material. Most preferably, the basic material is an 1°, 2°, 3°, or 4° amine-substituted sulfonic acid or its salt having from 2 to 18 carbon atoms (e.g., 4-morpholinepropanesulfonic acid, β-hydroxy-4-morpholinepropanesulfonic acid, 4-morpholineethanesulfonic acid, sodium 4-morpholinepropanesulfonate, sodium cysteate, 1-(3-sulfopropyl) pyridinium hydroxide, etc.), an 1°, 2°, 3°, or 4° amine-substituted alcohol (e.g., tetrakis(2-hydroxyethyl) ethylenediamine, 2-amino-1,3-propanediol, triethanolamine, or its acid salts, etc.) or amine-substituted carboxylic acid (e.g., glycine, alanine, 3-dimethylaminopropanoic acid, etc.)

EXAMPLES

The materials employed below were obtained from Aldrich Chemical Co. (Milwaukee, Wis.) unless otherwise specified. Materials were analyzed by one or more of the following techniques: $^1$H NMR, infrared, and mass spectroscopy; gel phase chromatography; and differential scanning calorimetry. The term MEK means methyl ethyl ketone. The term MEHQ means monomethyl ether of hydroquinone (4-methoxyphenol). The term IPA means isopropyl alcohol or isopropanol. Aluminum plates used for coatings in the following experiments were cleaned, degreased lithograde alloy, brush grained, electrochemically grained, anodized aluminum sheets. Exposures were conducted using a Berkey Ascor vacuum frame exposure unit (Berkey Technical Co., Woodside, N.Y.) equipped with a 2 kW Ascor Addalux Lamp No. 1406-01. A neutral density 21 step (0.15 absorbance units/step) sensitivity guide (Stouffer Graphic Arts Equipment Co., South Bend, Ind.) was used to measure the photosensitivity of the coatings prepared below.

The term solid step as used below refers to the highest numbered step which is completely dyed by the dye solution. The term open step refers to the highest numbered step which is completely free of ink after inking of the imaged plate. Rubb-Up™ Ink U-62 (Printing Development, Inc., Racine, Wis.) was used to ink plates described below. Primed polyester film used in the following examples is described in U.S. Pat. No. 4,335,220 (Jun. 15, 1982; Coney).

PREPARATIONS

Preparation of poly(methoxymethyl acrylate)

The following description is a two-step preparation of poly(methoxymethyl acrylate).

To a solution of 5.0 g (69 mmol) acrylic acid and 6.14 g (76.1 mmol) chloromethyl methyl ether in 25 ml methylene chloride was added a solution of 7.72 g (76.3 mmol) triethylamine in 25 ml methylene chloride at 5° C. The reaction mixture was allowed to warm to room temperature and was stirred overnight, poured into aqueous sodium bicarbonate, and extracted with ether. The ether layer was dried over anhydrous magnesium sulfate and concentrated in vacuo. The residue was distilled at 67–70° C. and 90–100 torr pressure to give 4.61 g of methoxymethyl acrylate (39.7 mmol, 57% yield).

A solution of 1.0 g methoxymethyl acrylate and 0.01 g azobis(isobutyronitrile) (also known in the art as AIBN) in 1 ml toluene was heated to 60° C. for 24 hr. The mixture was cooled and stirred with methanol for 24 hr. The resultant glassy material was placed in a vacuum oven at 50° C. and 0.1 torr for 24 hr to give poly(methoxymethyl acrylate).

Preparation of Photosensitve Composition

This preparation shows photosensitive compositions that may be imaged directly without traditional development methods, or alternatively, without aqueous development.

A photosensitive composition was prepared by mixing: 0.472 g poly(methoxymethyl acrylate), 0.028 g diphenyliodonium hexafluorophosphate 0.14 g 9,10-diethoxyanthracene and 5.0 ml MEK.

The photosensitive composition prepared above was filtered and coated onto two aluminum plates with a #7 wire-wound rod (R&D Specialties, Webster, N.Y.; wet thickness, 0.023 mm) and heated to 85° C. for 5 min. The samples were exposed for 1 min as described above.

One plate was developed by washing with hot tap water to give a positive-tone photoresist pattern. The exposed regions of the plate were wet by the water while unexposed regions remained dry. During the water rinse step the coating in the exposed areas was removed.

A solution of 17.5 g methoxymethyl acrylate and 0.26 g of AIBN in 18 ml MEK was heated to 60° C. for 24 hr, and then an additional 18 ml MEK was added. A solution using 0.5 ml of the polymer solution, 1.5 ml of a 10% solution of GANTREZ™ AN-139 (GAF Corp., Wayne, N.J.) in MEK, diphenyliodonium hexafluorophosphate, 9,10-diethoxyanthracene and 4.4 ml MEK was coated onto aluminum plates with a number 12 wire-wound rod and heated to 85° C. for 5 min. The samples were exposed for 10 sec as described above. The sample was swabbed with a 10% aqueous solution of tetra(hydroxyethyl)ethylenediamine, and then hand inked to give an open 2 step.

Preparation of Poly(Tetrahydropyran-2-yl Acrylate)

The following procedure describes the preparation of poly(tetrahydropyran-2-yl acrylate) in two steps.

A solution of 10.5 g (146 mmol, 10 ml) acrylic acid and 14.0 g (166 mmol, 15.2 ml) dihydropyran in 40 ml dichloromethane was stirred at room temperature for one day. The mixture was washed with saturated aqueous sodium bicarbonate and the organic layer was concentrated in vacuo. The residue was distilled to give 5.93 g (38.0 mmol, 26% yield) tetrahydropyran-2-yl acrylate, bp 40° C. at 0.2 torr.

A solution of 2.8 g (18 mmol) tetrahydropyran-2-yl acrylate prepared above and 0.028 g AIBN in 2.8 ml toluene was stirred at 60° C. for 24 hr to give a solution of poly (tetrahydropyran-2-yl acrylate). This solution was concentrated in vacuo to give the polymer.

Preparation of THP-Methacrylate

In a 5 liter 3 necked flask equipped with a mechanical stirrer was placed 1.06 g of 2,4-dinitrotoluene followed by 500 g (493 mL) of methacrylic acid and 488 g (530 mL) of dihydropyran. The mixture was stirred while 1 mL of concentrated (12 M) hydrochloric acid was added. The exothermic reaction warmed the mixture to approximately 60° C. after 30 minutes. At this point the temperature was maintained at 50° C. for 2.5 hours. The reaction mixture was allowed to cool to room temperature, and 500 mL of ethyl acetate was added followed by 1500 mL of aqueous NaOH solution. The aqueous layer was separated and had a pH of 14. The organic layer was washed again with 500 mL of aqueous NaCl solution. The organic layer was concentrated in vacuo. This gave a mixture of 88.1% wt % THP-methacrylate in ethyl acetate as determined by NMR. Yield 695.9 grams, 70.4%. To stabilize this solution at room temperature, 3.4 grams of MEHQ was added.

Preparation of Poly(THP-Methacrylate)

To a 250 mL 3-necked round bottomed flask was charged 11.554 g of THP-methacrylate (95.2% in EtOAc), 10 mL IPA, 0.6675 g EtOAc and 0.265 g AIBN. Nitrogen was bubbled through the mixture for 30 minutes. The mixture was heated to 60° C. After 1.25 hours the mixture was at 58° C and the reaction mixture was very viscous. The mixture was heated a total of three, hours. To the reaction mixture was added 90 mL of MEK and the polymer precipitated and eventually dissolved. To this solution was added 500 mL of hexane in a dropwise fashion. The solid was allowed to settle and the solvent was decanted. The solid was allowed to air dry.

Preparation of MATS-Copolymer

To 54 grams of a 92 wt % solution of THP-methacrylate and 5.03 grams of methacryloxypropyltrimethoxysilane (MATS) in 46 mL isopropanol was added 1.20 grams of AIBN. Nitrogen was bubbled through the solution for ten minutes prior heating. The mixture was heated for one hour at 70° C. under nitrogen and the mixture became thick. To this mixture (while still warm) was added 228 mL MEK followed by 5 mL of trimethylorthoformate and the solution was cooled to room temperature to give a solution 20 wt % in MATS-Copolymer. This copolymer represents a component useful in the photosensitive layer used in the practice of the present invention.

Preparation of Samples for Press and Imaging Evaluation

Top coat solutions were prepared as aqueous solutions with 0.2% Triton™ X-100 (Rohm and Haas) surfactant except Example 3 where 0.2% Triton™ QS-15 (Rohm and Haas) was used. The top coat solutions were applied using a #5 wire-wrapped rod over the standard construction. The standard construction consists of aluminum base coated with ~0.81 g/m² of an acid cleavable polymer (poly THP in the examples below) 71%, ditolyliodonium hexafluorophosphate 18%, 2-ethyl-9,10-dimethoxyanthracene 9%, and an indicator dye 2%. The top coat was then applied over the photosensitive layer and dried at 66° C. for approximately 1 minute. The top coat layer was ~0.43 g/m² after dry down if a 5 wt % solids top coat solution was applied. The plates were imaged in a Consolux vacuum frame with a triple beam mercury lamp, and then run on Ryobi 3200 ACD and Heidelberg SORMZ presses using a fountain containing water (86.3%), isopropyl alcohol (10%), triethanolamine (2.7%) and concentrated hydrochloric acid (1.0%). The ink used was either Flint Quicklith™ Black JVK24287 (tack of 12) or INX Inc. O/S Riegel 2 Process™ Black. Individual examples are presented in Tables I–IV.

Preparation of Samples for Water Solubility Evaluation

Each top coat solution described in Tables I–IV was coated onto the previously described standard construction using a #20 wire-wrapped rod. After coating, the samples were dried at 93° C. for approximately 2 minutes. Standard 10.2×15.2 cm pieces were punched from each condition. One piece from each condition was weighed, thoroughly washed with distilled water to remove the top coat completely, dried in an oven at approximately 90° C. (approximately 3 minutes) and then re-weighed to determine the amount of top coating present. A 30.5 cm diameter and 30.5 cm high tank was filled with 12 L of water and enough 1.3 cm diameter glass beads to form a 2.5 cm layer on the bottom of the tank. The water was kept at 25° C. A mechanical-air stirrer equipped with a 5 cm diameter three blade paddle and operating at 1027 rpm was used to keep the water circulating. Standard 10.2×15.2 cm pieces from each condition were weighed and then submersed for 15 seconds in the bath. The plates were then put in an oven at approximately 90° C. until dry (approximately 4 minutes) and then reweighed. The percentage of the top coat removed in the bath was determined by the ratio of the weight of material lost from hand washing versus the weight of material lost from bath submersion.

Contact Angle With Water

The contact angle of a 0.5 µL drop of water on the surface of the plate was measured with a standard goniometer.

Glass Effect

Difference in apparent photospeed of plate between portions of the plate under the transparency and portions under the glass during exposure.

Initial Roll-Up

B—Image blinded not taking ink
S—Ink was printed in non-image area (scummed)
W—image does not take ink evenly and is splotchy Overall Roll-Up good—prints clean image in less than 25 impressions
fair—prints clean image after 25 to 50 impressions
poor—prints clean image after 50 to 75 impressions
bad—does not print clean image in less than 75 impressions

TABLE I

Polymer Based Top Coats

| # | Top coat | Weight % Solid | Contact Angle | † Solubility | Glass |
|---|---|---|---|---|---|
| C | No top coat, unexposed | — | 63 | NA | bad |
| C | No top coat, exposed | — | 47 | NA | bad |
| 1 | Polymethacrylic acid Na salt*/Gum Arabic, 9:1 *Polysciences #21170 MW 15,000 | 5 | 15 | 88 | none |
| 2 | Polyacrylic acid*/Gum Arabic, 1:1 *Rohm & Haas Acrysol ™ A-1 | 5 | 19 | 80 | none |
| 3 | SiO₂/Polyacrylamide*, 7:3 *American Cyanamid Cyanamer ™ P-26 | 5 | 21 | 67 | none |
| 4 | Polymethacrylic acid Na salt | 5 | 19 | 79 | none |

TABLE I-continued

Polymer Based Top Coats

| # | Top coat | Weight % Solid | Contact Angle | † Solubility | Glass |
|---|----------|----------------|---------------|--------------|-------|
| 5 | Polysciences #21170 MW 15,000 Polymethacrylic acid $NH_4$ salt | 5 | 26 | 92 | none |
| 6 | Polysciences #21169 MW 15,000 Polyvinyl Sulfonic Acid Na Salt Aldrich #27,842-4 | 5 | 8 | 84 | none |
| 7 | Polyacrylamide American Cyanamid Cyanamer ™ P-26 | 5 | 22 | 74 | none |
| 8 | Polyvinylpyrrolidone (PVP) GAF MW 15,000 | 5 | 11 | 92 | none |
| 9 | Polyvinyl alcohol (PVA) Aldrich #36,317-0 MW 13–23,000 | 5 | 23 | 97 | none |
| 10 | Polydiallyldimethyl ammonium chloride Polysciences #19898 | 5 | 19 | 82 | none |
| 11 | PVP*/PVA *GAF 5-630 | 5 | 18 | 74 | none |
| 12 | Polethylene Oxide Aldrich #18,198-6 MW 100,000 | 5 | 27 | 40 | none |

†Solubility in water measured as the percentage of top coating removed when placed in a circulating bath of water at 25° C. for 15 seconds (100 indicates top coat completely removed).

TABLE II

Roll-up Data for Polymer Based Top Coats

| | | Ryobi Roll-up | | Heidelberg Roll-up | |
|---|---|---|---|---|---|
| # | Top Coat | Initial | Overall | Initial | Overall |
| C | No top coat, unexposed | S | bad | W | bad |
| C | No top coat, exposed | S | bad | W | bad |
| 1 | Polymethacrylic acid Na salt*/Gum Arabic, 9:1 *Polysciences #21170 MW 15,000 | S | fair | B | good |
| 2 | Polyacrylic acid*/Gum Arabic, 1:1 *Rohm & Haas Acrysol ™ A-1 | S | fair | B | good |
| 3 | $SiO_2$/Polyacrylamide*, 7:3 *American Cyanamid Cyanamer ™ P-26 | B | good | B | good |
| 4 | Polymethacrylic acid Na salt Polysciences #21170 MW 15,000 | S | fair | B | good |
| 5 | Polymethacrylic acid $NH_4$ salt Polysciences #21169 MW 15,000 | S | poor | S | bad |
| 6 | Polyvinyl Sulfonic Acid Na Salt Aldrich #27,842-4 | S | fair | B | good |
| 7 | Polyacrylamide American Cyanamid Cyanamer ™ P-26 | — | — | B | good |
| 8 | Polyvinylpyrrolidone (PVP) GAF MW 15,000 | S | poor | B | good |
| 9 | Polyvinyl alcohol (PVA) Aldrich #36,317-0 MW 13–23,000 | — | — | B | good |
| 10 | Polydiallyldimethyl ammonium chloride Polysciences #19898 | — | — | B | poor |
| 11 | PVP*/PVA *GAF 5-630 | — | — | B | good |
| 12 | Polethylene Oxide Aldrich #18,198-6 MW 100,000 | — | — | B | bad |

TABLE III

Non-polymer Based Top Coats

| # | Top coat | Weight % Solid | Contact Angle | † Solubility | Glass |
|---|----------|----------------|---------------|--------------|-------|
| 13 | $Mg(NO)_3$ | 5 | >5 | 100†,†† | slight |
| 14 | $Mg(NO)_3$ | 2.5 | <5 | — | slight |
| 15 | $Mg(NO)_3$ | 1 | <5 | — | slight |
| 16 | Lithium Acetate | 5 | 6 | 100††† | slight |
| 17 | Sodium Nitrate | 5 | 24 | 87 | slight |
| 18 | Magnesium Chloride | 5 | 5 | 95 | slight |
| 19 | Ammonium Nitrate | 5 | 22 | 96 | slight |
| 20 | Sodium Chloride | 5 | 35 | 96 | slight |
| 21 | Nalco 8676 ($Al_2O_3$) | 10 | 7 | — | slight |
| 22 | Nalco 8676 ($Al_2O_3$) | 5 | 7 | 94 | slight |
| 23 | Nalco 8676 ($Al_2O_3$) | 2.5 | 7 | — | slight |
| 24 | Nalco 2327 ($SiO_2$) | 5 | 12 | 5 | slight |
| 25 | $Mg(NO)_3$/Nalco 8676 ($Al_2O_3$), 1:2.5 | 3.5 | 10 | 67 | slight |
| 26 | $Mg(NO)_3$/4-morpholine-ethanesulfonic acid, 1:2 | 3 | 42 | 73 | slight |
| 27 | $Mg(NO)_3$/Polymethacrylic acid Na salt, 1:1 | 5 | 10 | 93 | — |

†Solubility in water measured as the percentage of top coating removed when placed in a circulating bath of water at 25° C. for 15 seconds (100 indicates top coat completely removed).
††Measured solubility 102%.
†††Measured solubility 104%.

TABLE IV

Roll-up Data for Non-polymer Based Top Coats

| | | Ryobi Roll-up | | Heidelberg Roll-up | |
|---|---|---|---|---|---|
| # | Top Coat | Initial | Overall | Initial | Overall |
| 13 | $Mg(NO)_3$ | B | poor | — | — |
| 14 | $Mg(NO)_3$ | B | good | B | poor |
| 15 | $Mg(NO)_3$ | B | good | — | — |
| 16 | Lithium Acetate | B | good | B | good |
| 17 | Sodium Nitrate | B | good | B | fair |
| 18 | Magnesium Chloride | B | good | W | bad |
| 19 | Ammonium Nitrate | B | good | W | bad |

TABLE IV-continued

Roll-up Data for Non-polymer Based Top Coats

| # | Top Coat | Ryobi Roll-up Initial | Ryobi Roll-up Overall | Heidelberg Roll-up Initial | Heidelberg Roll-up Overall |
|---|---|---|---|---|---|
| 20 | Sodium Chloride | B | good | W | poor |
| 21 | Nalco 8676 ($Al_2O_3$) | S | fair | — | — |
| 22 | Nalco 8676 ($Al_2O_3$) | S | good | — | — |
| 23 | Nalco 8676 ($Al_2O_3$) | S | good | B | fair |
| 24 | Nalco 2327 ($SiO_2$) | B | bad | — | — |
| 25 | $Mg(NO)_3$/Nalco 8676 ($Al_2O_3$), 1:2.5 | B | good | B | fair |
| 26 | $Mg(NO)_3$/4-morpholine-ethanesulfonic acid, 1:2 | B | good | — | — |
| 27 | $Mg(NO)_3$/Polymethacrylic acid Na salt, 1:1 | S | fair | — | — |

EXAMPLE 28

Odor Reduction

Five 43.2×78.7 cm pieces of a plate construction top coated with 0.43 g/m² of the top coat of Example 2 were individually placed in a Consolux vacuum frame and fully exposed to actinic radiation. The exposure was sufficient to completely photo-bleach the entire plate. Each plate was monitored for odor after exposure. No odor was observed after single and multiple exposures when the top coat of Example 2 was present. A similar plate without a top coat was exposed for the same amount of time in the vacuum frame. After exposure, a strong odor was observed both inside and outside the vacuum frame. Another plate coated with 0.43 g/m² of the top coat of Example 3 was similarly exposed. After exposure, a slight odor was observed in the vacuum frame.

EXAMPLE 29

Coating Thickness

The effect of top coat thickness was identified by rolling up two constructions top coated with a 1:1 mixture of polyacrylic acid and gum arabic. The top coats were applied from a 5 wt % solution at two different coating weights. One top coat was applied using a #5 wire-wrapped rod and the other a #12 wire-wrapped rod. Both plates were rolled up on the Ryobi under similar conditions. The plate with the thinnest top coat scummed for 30–40 sheets before a good copy was produced while the sample with a thicker top coat scummed and did not print a good copy even after 60 sheets.

What is claimed is:

1. A composite structure comprising a photosensitive article mounted on press wherein the photosensitive article comprises a substrate having on at least one surface thereof (i) a latent imaged photosensitive composition having surface areas which are more hydrophilic in a first area and less hydrophilic in a second area as a result of being exposed or not exposed to radiation, and (ii) a hydrophilic, non-photosensitive protective layer over the photosensitive composition wherein the protective keyer has a contact angle with water which is less than the contact angle of said photosensitive composition with water and wherein at least 40 percent by weight of said protective layer can be removed in a water circulating bath at 25 degrees C. in less than 20 seconds.

2. The composite structure of claim 1 wherein the contact angle of said protective layer with water is less than 47°.

3. The composite structure of claim 1 wherein said protective layer is selected from the group consisting of polymeric film, inorganic salt, sols, and mixtures thereof.

4. The composite structure of claim 3 wherein said protective layer is a water soluble polymeric film.

5. The composite structure of claim 4 wherein said polymeric film is a polymer selected from the class consisting of polymethacrylic acid, polyacrylic acid, polyvinylsulfonic acid, polyvinylpyrrolidone, polyvinyl alcohol, polyacrylamide, and gum arabic.

6. The composite structure of claim 1 wherein the photosensitive composition is a positive-acting, acid-cleavable composition comprising an iodonium photoinitiator.

7. The composite structure of claim 1 wherein said photosensitive composition comprises a photoinitiator which generates an acid upon exposure to radiation and a polymer having a backbone having attached thereon pendant acid labile groups represented by the formula:

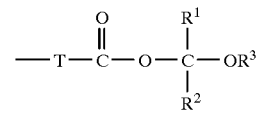

where; $R^1$ and $R^2$ each represent H or an alkyl group with 1 to 18 carbon atoms with the proviso that at least one of $R^1$ and $R^2$ must be hydrogen; $R^3$ represents an alkyl group with 1 to 18 carbons; or any two of $R^1$, $R^2$, and $R^3$ may together form a ring having 3 to 36 carbon atoms; and T represents a divalent linking group bonded to said polymer backbone and contains 0 to 18 carbon atoms where up to one of each three carbon atoms may be replaced with oxygen, nitrogen, or sulfur atoms or combinations thereof.

8. The composite structure of claim 7 wherein said photoinitiator is a diaryliodonium salt.

9. The composite structure of claim 7 wherein said photosensitive composition further comprises a sensitizer.

10. A photosensitive article comprising a substrate having on at least one surface thereof a photosensitive composition which upon irradiation provides surface areas which are, or on press become, more hydrophilic in one area and less hydrophilic in a second area, said one area and said second area being differentiated by being exposed or not exposed to radiation, and having over said photosensitive composition a hydrophilic, non-photosensitive protective layer comprising an inorganic salt selected from the class consisting of halide, nitrate, and acetate salt of ammonium, sodium, magnesium, or lithium, said protective layer having a contact angle with water which is less than the contact angle of said photosensitive composition with water, wherein said protective layer remains on the surface of said photosensitive layer after exposure.

11. A photosensitive article comprising a substrate having on at least one surface thereof a photosensitive composition which upon irradiation provides surface areas which are, or on press become, more hydrophilic in one area and less hydrophilic in a second area, said one area and said second area being differentiated by being exposed or not exposed to radiation, and having over said photosensitive composition a hydrophilic, non-photosensitive protective layer comprising a sol selected from the class consisting of hydrophilic colloidal solutions of alumina, silica, titanium oxide, tin oxide, and zirconium oxide, said protective layer having a contact angle with water which is less than the contact angle of said photosensitive composition with water, wherein said protective layer remains on the surface of said photosensitive layer after exposure.

* * * * *

UNITED STATES PATENT AND TRADEMARK OFFICE
CERTIFICATE OF CORRECTION

PATENT NO. : 5,939,237
DATED : Aug. 17, 1999
INVENTOR(S) : Gardner, Jr. et al.

It is certified that error appears in the above-identified patent and that said Letters Patent is hereby corrected as shown below:

Col. 15, line 58, "keyer" should be --layer--.

Signed and Sealed this

Thirty-first Day of October, 2000

*Attest:*

*Attesting Officer*

Q. TODD DICKINSON
*Director of Patents and Trademarks*